United States Patent
Lee et al.

(10) Patent No.: US 7,142,430 B2
(45) Date of Patent: Nov. 28, 2006

(54) HEAT DISSIPATING DEVICE ASSEMBLY

(75) Inventors: Hsieh-Kun Lee, Tu-Cheng (TW);
Wan-Lin Xia, Shenzhen (CN);
Bao-Chun Chen, Shenzhen (CN);
Bo-Yong Yang, Shenzhen (CN);
Jin-Song Feng, Shenzhen (CN); Tao Li, Shenzhen (CN)

(73) Assignees: Fu Zhun Precision Industry (Shen Zhen) Co., Ltd., Guangdong Province (CN); Foxconn Technology Co., Ltd. (TW)

( * ) Notice: Subject to any disclaimer, the term of this patent is extended or adjusted under 35 U.S.C. 154(b) by 182 days.

(21) Appl. No.: 10/953,654

(22) Filed: Sep. 29, 2004

(65) Prior Publication Data

US 2005/0117306 A1    Jun. 2, 2005

(30) Foreign Application Priority Data

Nov. 29, 2003    (CN) .......................... 2003 2 0118845

(51) Int. Cl.
*H05K 7/20* (2006.01)

(52) U.S. Cl. .................. 361/719; 361/704; 257/718; 174/16.3; 165/80.3

(58) Field of Classification Search ................. 361/704, 361/719; 257/718, 719; 165/80.3, 185
See application file for complete search history.

(56) References Cited

U.S. PATENT DOCUMENTS

| 5,251,101 | A  | * | 10/1993 | Liu ............................ 361/717 |
| 5,477,916 | A  | * | 12/1995 | Lin ............................ 165/80.3 |
| 5,579,205 | A  | * | 11/1996 | Tustaniwskyj et al. ..... 361/704 |
| 6,280,222 | B1 | * | 8/2001  | Walkup ....................... 439/331 |
| 6,449,154 | B1 |   | 9/2002  | Yoneyama et al. .......... 361/704 |
| 6,549,412 | B1 | * | 4/2003  | Ma ............................. 361/704 |
| 6,788,538 | B1 | * | 9/2004  | Gibbs et al. ................ 361/704 |
| 6,822,869 | B1 | * | 11/2004 | Huang et al. ............... 361/704 |
| 6,867,975 | B1 | * | 3/2005  | Kashiwagi .................. 361/704 |
| 7,019,979 | B1 | * | 3/2006  | Wang et al. ................ 361/719 |

* cited by examiner

*Primary Examiner*—Boris Chérvinsky
(74) *Attorney, Agent, or Firm*—Morris Manning & Martin; Tim Tingkang Xia, Esq.

(57) ABSTRACT

A heat dissipating device assembly for an electronic components (70), includes a heat sink (10) for contacting the electronic component, and a locking device (20) and a back plate unit (40) for cooperatively mounting the heat sink to the electronic component. The locking device includes a retention module (28) located around the electronic component for supporting the heat sink thereon, and a clip (30) pivotably attached to the retention module. The clip includes a pressing portion and a pushing portion. The clip is pivotable between a first position in which the clip presses the heat sink toward the electronic component and a second position in which the clip pushes the heat sink in a direction away from the electronic component.

19 Claims, 7 Drawing Sheets

HEAT DISSIPATING DEVICE ASSEMBLY

TECHNICAL FIELD

The present invention relates to a heat dissipating device assembly, and particularly to a heat dissipating device assembly incorporating a locking device which can conveniently mount a heat sink to an electronic component.

BACKGROUND

As computer technology continues to advance, electronic components such as central processing units (CPUs) of computers are made to provide faster operational speed and greater functional capabilities. When a CPU operates at a high speed in a computer enclosure, its temperature increases greatly and dramatically. It is desirable to dissipate the generated heat quickly, for example, by using a heat sink attached to the CPU in the enclosure. This allows the CPU and other electronic components in the enclosure to function within their normal operating temperature ranges, thereby assuring the quality of data management, storage and transfer. Generally, a locking device is required for mounting the heat sink to the CPU.

Figure 11:
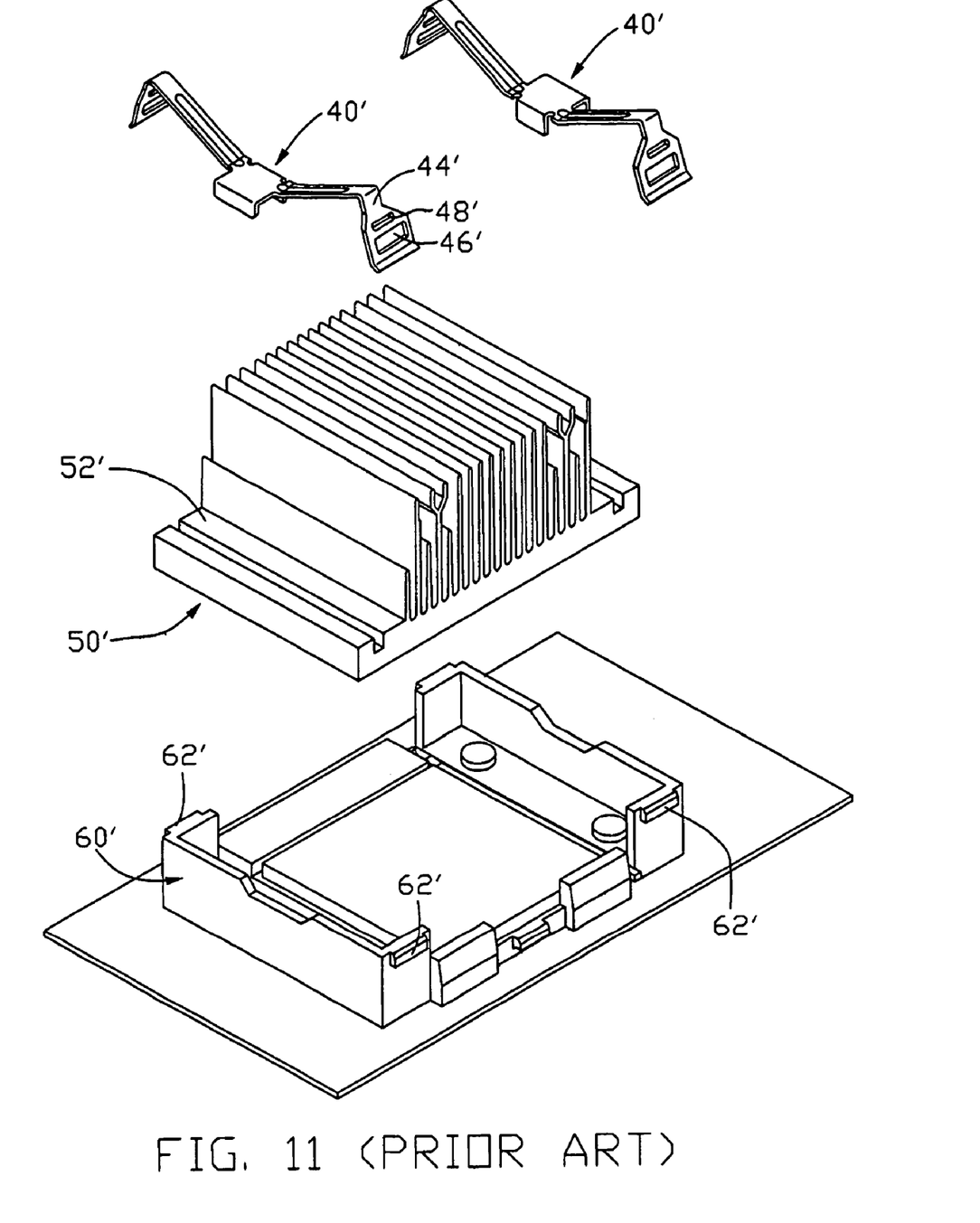
FIG. 11 is an exploded veiw of a conventional heat dissipating device assembly.

FIG. 11 show a conventional locking device for mounting a heat sink 50' to a CPU mounted on a printed circuit board. The locking device comprises a pair of clips 40' and a retention module 60'. Each clip 40' comprises a pair of locking legs 44'. Each locking leg 44' defines a locking opening 46' and a slot 48' adjacent to the locking opening 46'. The heat sink 50' comprises a pair of shoulders 52' formed at opposite side portions thereof. The retention module 60' is mounted on the printed circuit board and surrounds the CPU. The retention module 60' comprises four of barbs 62' formed at four corners thereof. In assembly, the heat sink 50' is placed on the CPU. The pair of clips 40' are placed on the shoulders 52'. The locking opening 46' in one locking leg 44' of each clip 40' is engaged with the corresponding barb 62' of the retention module 60'. Tool is inserted into the slot 48' in the other locking leg 44' to pivot the other locking leg 44' outwardly to allow the corresponding locking opening 46' to engage with the corresponding barb 62' of the retention module 60' to thereby secure the heat sink 50' to the CPU. In disassembly, tools are required to pivot the locking legs 44' outwardly to have the legs 44 released from the corresponding barbs 62'. However, it is inconvenient to use tools in assembly or disassembly. Furthermore, each clip 40' is integrally formed and therefore has a large rigidity. As a result, large force is needed in operation.

SUMMARY OF THE INVENTION

Accordingly, an object of the present invention is to provide a heat dissipating device assembly which can firmly and conveniently mount a heat sink to an electronic component.

To achieve the above-mentioned object, a heat dissipating device assembly in accordance with a preferred embodiment of the present invention comprises a heat sink for contacting a heat generating component, and a locking device for mounting the heat sink to the heat generating component. The locking device comprises a retention module located around the heat generating component, and a clip pivotably attached to the retention module. The clip comprises a pressing portion. The heat sink rests on the retention module. The clip is pivotable between a release position in which the heat sink is set free from the pressing portion and a locked position in which the pressing portion presses the heat sink.

Other objects, advantages and novel features of the present invention will be drawn from the following detailed description of a preferred embodiment of the present invention with attached drawings, in which:

DETAILED DESCRIPTION OF PREFERRED EMBODIMENTS

Figure 1:
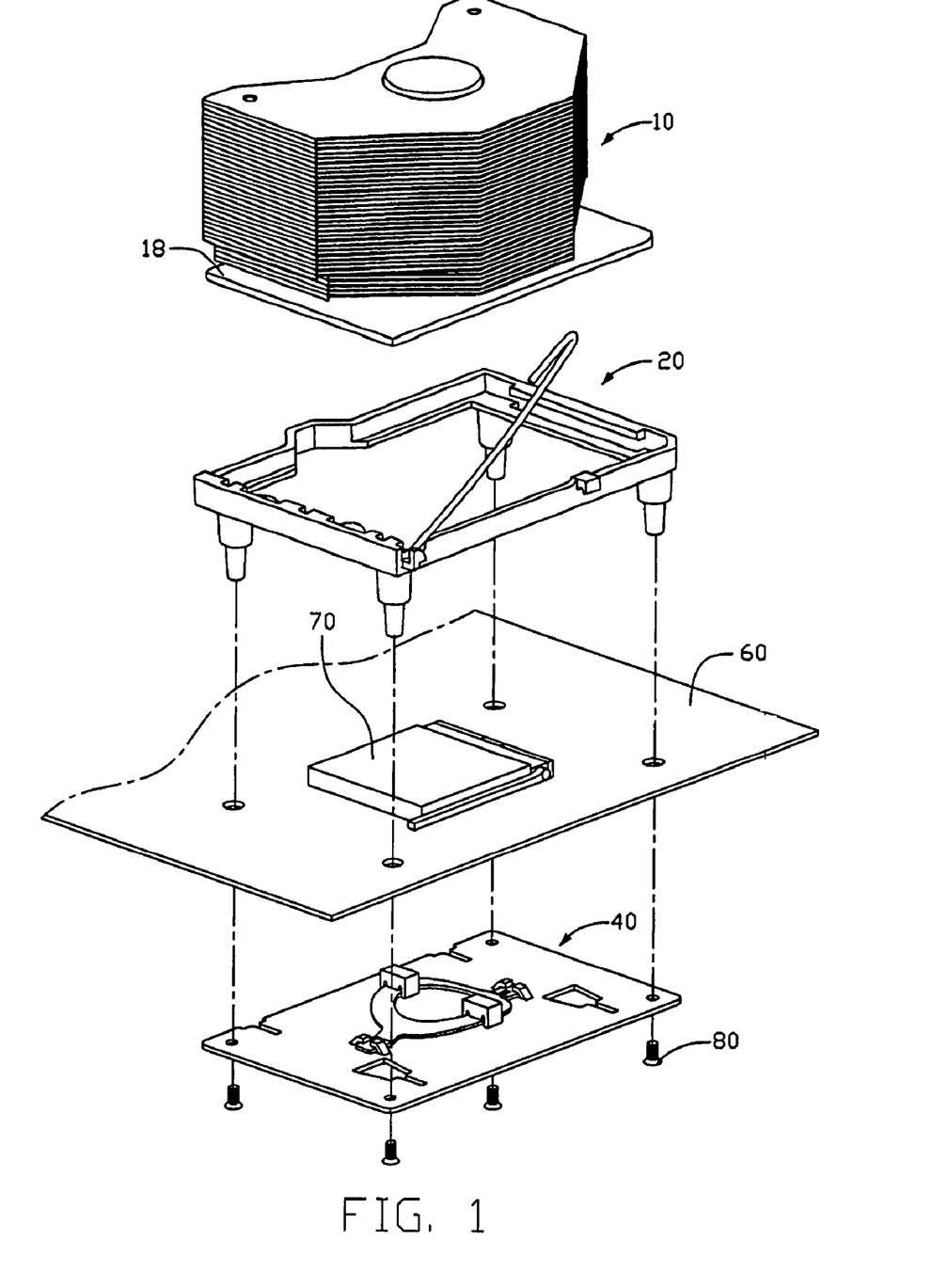
FIG. 1 is an exploded, isometric view of a heat dissipating device assembly in accordance with a preferred embodiment of the present invention, together with an electronic component mounted on a printed circuit board.

FIG. 1 shows a heat dissipating device assembly in accordance with a preferred embodiment of the present invention, together with an electronic component 70 mounted on a printed circuit board 60. The heat dissipating device assembly comprises a heat sink 10, a locking device 20 and a back plate unit 40.

Figure 2:
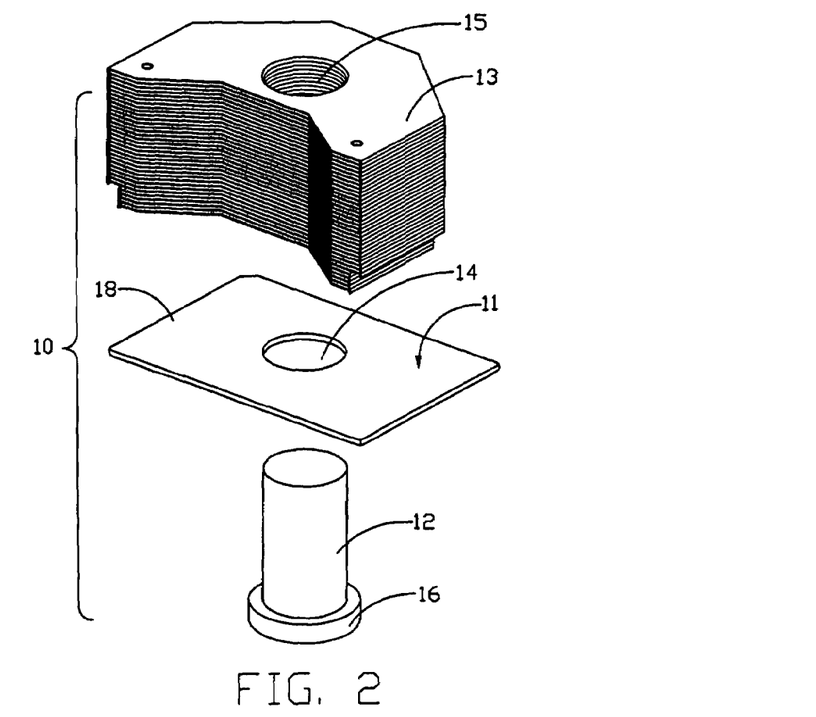
FIG. 2 is an exploded view of the heat sink of FIG. 1.

Referring to FIG. 2, the heat sink 10 comprises a rectangular base plate 11, a column 12 and a plurality of fins 13. The base plate 11 defines a through hole 14 in a center thereof. The column 12 has a basis 16 formed at a bottom thereof. The column 12 is a solid column. Alternatively, the column 12 is a hollow heat pipe filled with coolant. The diameter of the basis 16 is larger than that of the column 12. The fins 13 have flanges formed at peripheries thereof for spacing the fins with predetermined distance. The fins commonly define axial holes 15 for receiving the column 12 therein. The fins 13 have flanges formed around the holes 15 for increasing contact surface between the column 12 and the fins 13. The column 12 extends through the hole 14 of the base plate 11 and the holes 15 of the fins 13, and becomes combined with the base plate 11 and the fins 13 via soldering. The fins 13 are stacked with each other along the lengthwise direction of the column 12 on the base plate 11. A border portion 18 is formed at the base plate 11 further extending outside reach of the fins 13 (See FIG. 1).

Figure 3:
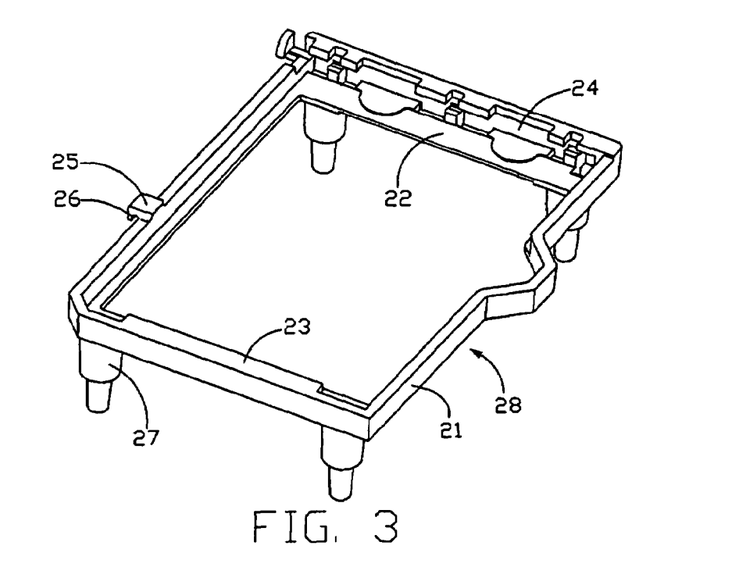
FIG. 3 is an isometric view of the frame of FIG. 1.
Figure 4:
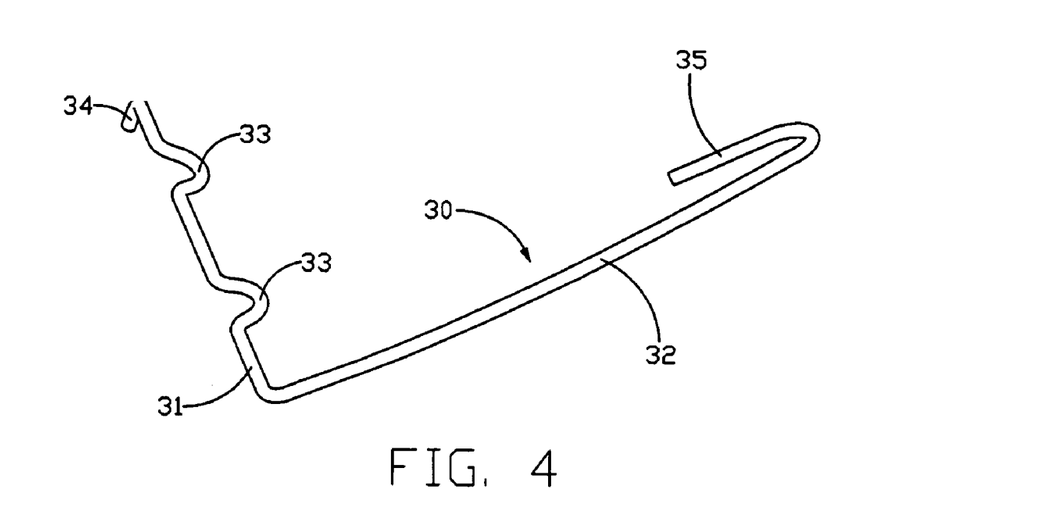
FIG. 4 is an isometric view of the clip of FIG. 1.

Referring to FIGS. 3–4, the locking device 20 comprises a retention module 28 and a wire clip 30. The retention module 28 comprises four walls 21. A flange 22 is formed inwardly from the bottom of the inner periphery of the walls 21. An abutting strip 23 is formed inwardly from the top of one wall 21. A space is therefore formed between the abutting strip 23 and the flange 22 for receiving the border portion 18 of the base plate 11 of the heat sink 10. A groove 24 is formed on an opposite wall 21 opposing to the wall from which the abutting strip 23 is formed. A block 25 is formed outwardly from another wall 21. A retaining slot 26 is defined in the bottom of the block 25. Four hollow locking feet 27 extend downwardly from four corners of the retention module 28. Each locking foot 27 defines a screw hole therein. The clip 30 is made by bending a metal wire and comprises a connecting section 31 and a locking section 32. The connecting section 31 comprises a pair of pressing portions 33 bent therefrom, and a pushing portion 34 formed at a distal end thereof. The free end of the locking section 32 opposing to the connecting section 31 is bent to form a handle 35 for facilitating operation.

Figure 5:
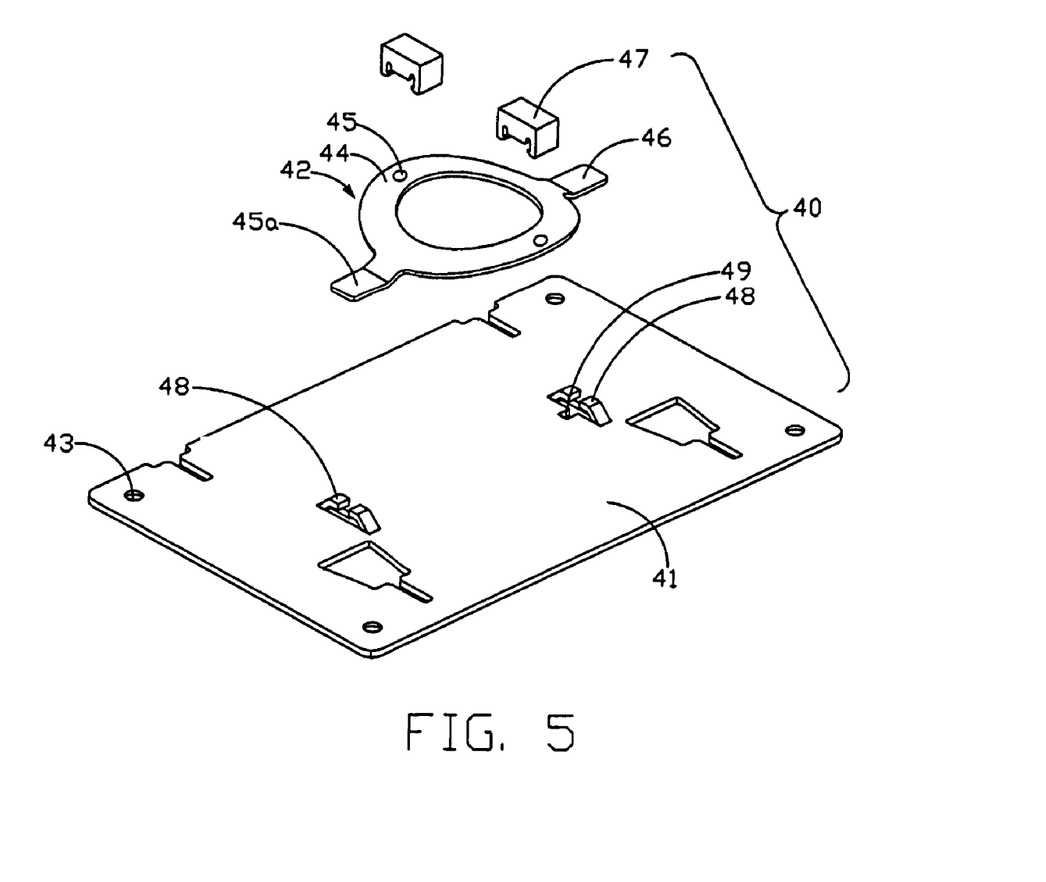
FIG. 5 is an exploded view of the back plate unit of FIG. 1.
Figure 6:
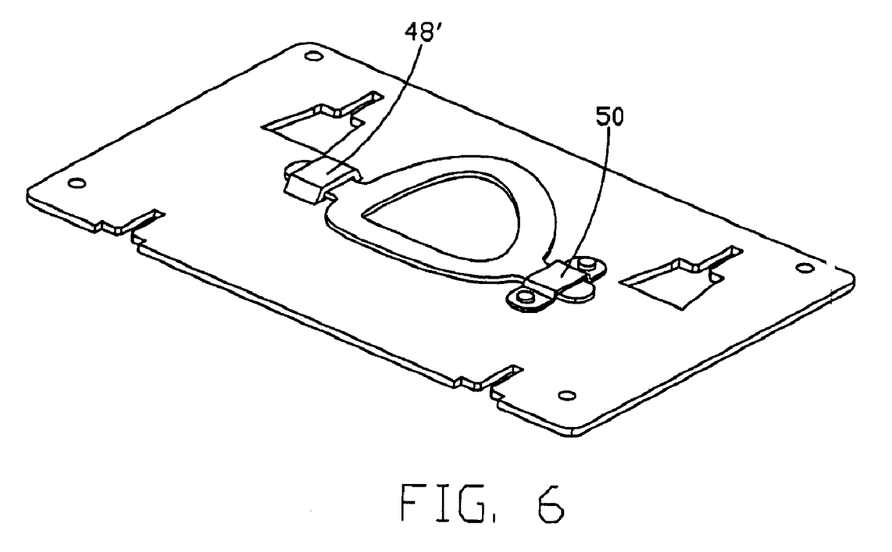
FIG. 6 is an exploded view of the back plate unit in accordance with an alternative embodiment.
Figure 7:
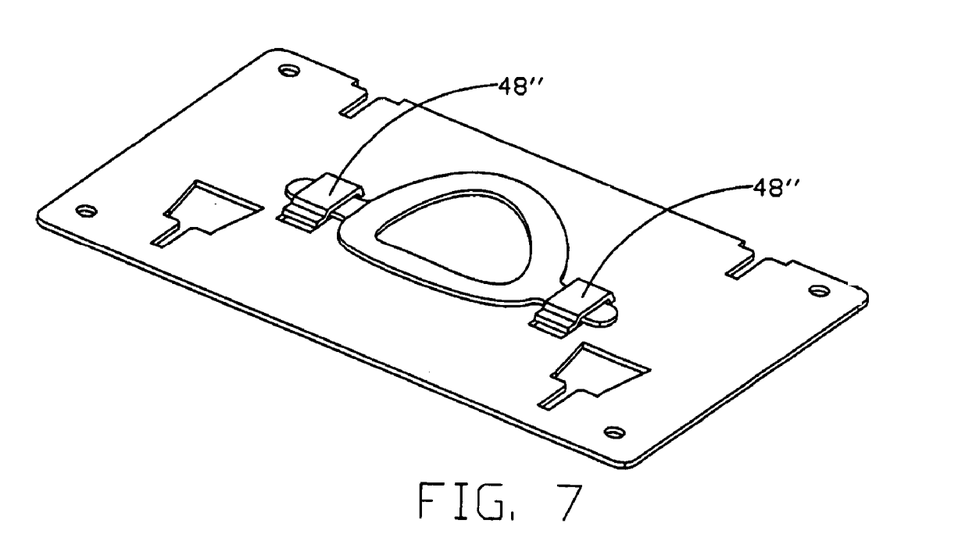
FIG. 7 is an exploded view of the back plate unit in accordance with a further alternative embodiment.

Referring also to FIG. 5, the back plate unit 40 comprises a rectangular back plate 41 and an elastic gasket 42. The gasket 42 comprises a ring body consisting of a pair of wings 44 slightly bent and facing to each other. The middle portions of the wings 44 are the highest portions of the gasket 42 away from the back plate 41. Each wing 44 forms a projection 45 on the middle portion thereof for being snugly received in a retaining recess of a bearing block 47 to thereby secure the bearing block 47 thereon. A pair of tabs 46 extends outwardly from two junctions of the wings 44 respectively. Each tab 46 forms a projection (not visible) on the bottom thereof. The back plate 41 defines four through holes 43 in four corner portions thereof. A pair of fasteners is formed on the back plate 41 for securing the gasket 42 to the back plate 41. Each fastener comprises a pair of latches 48 stamped upwardly from the back plate 41. A notch 49 is defined in the back plate 41 adjacent to each fastener and corresponding to the projection of the tab 46 of the gasket 42. The gasket 42 is secured to the back plate 41 via the tabs 46 being sandwiched between the latches 48 and the back plate 41, and the projections of the tabs 46 being received in the notches 49 of the back plate 41. Alternatively, the pair of fasteners can be structured as one latch 48' stamped upwardly from the back plate 41 and a pressing tab 50 secured on the back plate 41 as shown in FIG. 6. Alternatively, the pair of fasteners can also be structured as a pair of latches 48" stamped upwardly from the back plate 41 as shown in FIG. 7.

Figure 8:
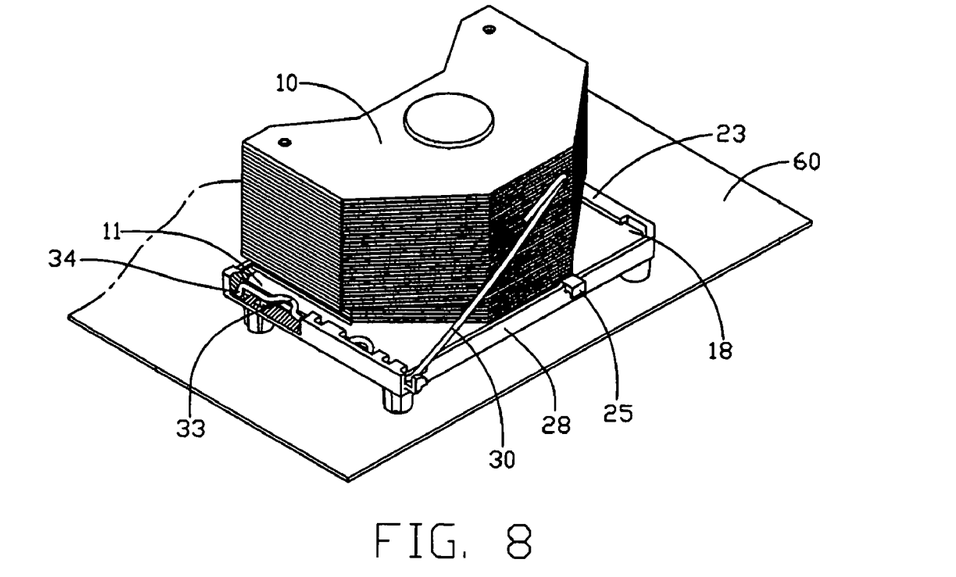
FIG. 8 is an assembled view of FIG. 1 with the locking device located in a release position and one part of the retention module cutaway.
Figure 9:
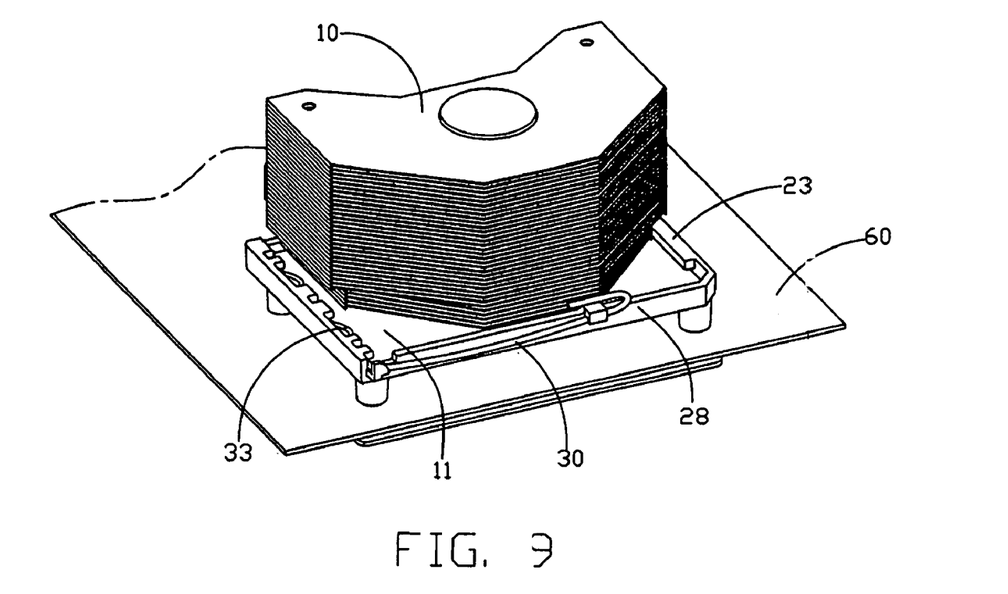
FIG. 9 is an assembled view of FIG. 1 with the locking device located at a locked position.
Figure 10:
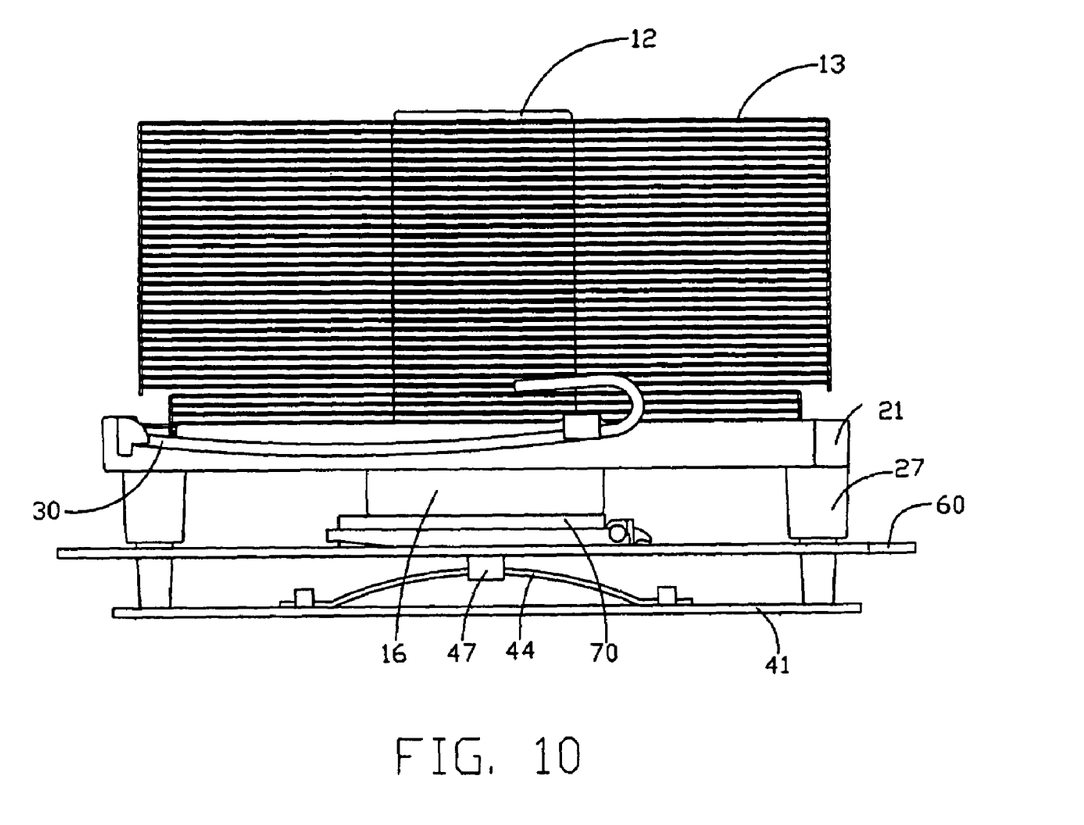
FIG. 10 is a front elevational view of FIG. 9.

Referring to FIGS. 8–9, in assembly, the locking device 28 is placed on the printed circuit board 60 with the locking feet 27 extending through the printed circuit board 60 and the clip 30 being located in a release position. The back plate unit 40 is secured below the printed circuit board 60 via screws 80 extending through the holes 43 of the back plate 41 to engage with the corresponding locking feet 27 of the retention module 28. The gasket 42 is squeezed between the printed circuit board 60 and the back plate 41. The gasket 42 is deformed and the bearing blocks 47 bear against the printed circuit board 60 below the electronic component 70. The heat sink 10 is placed on the retention module 28 with the base plate 11 supported by the flange 22 of the retention module 28 and one side of the border portion 18 of the base plate 11 being sandwiched between the abutting strip 23 and the flange 22 of the retention module 28. The handle 35 of the clip 30 is pressed downwardly until the locking section 32 of the clip 30 reaches and is retained in the retaining slot 26 of the block 25. The clip 30 is deformed. The pressing portions 33 of the clip 30 are pivoted to a horizontal position to press the corresponding border portion 18 of the base plate 11 downwardly. Thus, the heat sink 10 is firmly secured to the retention module 28. At that time, the clip 30 is located in a locked position. The bearing blocks 47 bear against the printed circuit board 60 to enforce intension of resisting bend of the printed circuit board 60 and simultaneously to cause the basis 16 of the heat sink 10 to intimately contact the electronic component 70 for absorbing heat therefrom.

In disassembly, the handle 35 of the clip 30 is operated to cause the locking section 32 of the clip 30 to be released from the retaining slot 26 of the retaining block 25. The handle 35 continues to pivot upwardly afterwards so that the pressing portions 33 are totally pivoted away from the base plate 11. The pushing portion 34 of the clip 30 is pivoted to push the bottom surface of the base plate 11 of the heat sink 10 upwardly to facilitate removal of the heat sink 10 from the retention module 18.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipating device assembly for an electronic component mounted on a circuit board, comprising:
   a heat sink adapted for contacting the electronic component; and
   a locking device comprising:
   a retention module adapted for being located about the electronic component and comprising a flange formed at an inner periphery thereof;
   a back plate unit adapted for being attached below the circuit board, the back plate unit comprising a back plate secured with the retention module and a bent elastic gasket adapted for bearing against the circuit board to resist bend of the circuit board; and
   a clip pivotably attached to the retention module, the clip comprising a pressing portion, wherein the heat sink rests on the flange of the retention module and the clip is pivotable between a release position in which the heat sink is removable from the retention module and a locked position in which the pressing portion presses the heat sink.

2. The heat dissipating device assembly as claimed in claim 1, wherein the retention module comprises four walls connected with each other, the flange being formed inwardly from bottoms of the walls.

3. The heat dissipating device assembly as claimed in claim 2, wherein the heat sink comprises a base plate and a plurality of fins arranged on the base plate, and the retention module comprises an abutting strip spacing from the flange, the base plate of the the sink being sandwiched between the abutting strip and the flange.

4. The heat dissipating device assembly as claimed in claim 3, wherein the clip is L-shaped and comprises a connecting section pivotably attached to one of the walls opposing the abutting strip, and a locking section, the pressing portion being formed at the connecting sectaon.

5. The heat dissipating device assembly as claimed in claim 4, wherein the retention module comprises a retaining block formed at another one of the walls, the block defining a retaining slot for engaging with the locking section at the locked position.

6. The heat dissipating device assembly as claimed in claim 1, wherein the gasket comprises a pair of wings and a pair of tabs extending from junctions of the wings and secured with back plate, the middle portions of the wings being highest portions of the gasket away from the back plate.

7. The heat dissipating device assembly as claimed in claim 6, wherein a pair of bearing blocks is secured on the middle portions of the gasket for bearing the circuit board.

8. The heat dissipating device assembly as claimed in claim 6, wherein a pair of latches are formed on the back plate, wherein the gasket is secured to the back plate via the tabs of the gasket being sandwiched between the latches and the back plate.

9. The heat dissipating device assembly as claimed in claim 3, wherein the heat sink comprises a column extending through the base plate and the fins, and wherein the column at an end thereof comprises a basis located at one side of the flange opposite to the base plate.

10. A combination comprising:
a circuit board with an electronic component provided thereon;
a locking device comprising a retention module arranged on the circuit board and a clip pivotably attached to the retention module, the clip comprising a pressing portion;
a back plate unit located below the circuit board, the unit comprising a back plate secured with the retention module and an elastic gasket sandwiched between the circuit board and the back plate; and
a heat sink placed on the retention module and contacting the electronic component, wherein the clip is pivotable between a release position in which the heat sink is freed from the pressing portion and a locked position in which the pressing portion presses the heat sink toward the electronic component;
wherein the elastic gasket is secured on the back plate and wherein the gasket comprises a pair of wings and a pair of tabs extending from junctions of the wings and secured with back plate, the middle portions of the wings being highest portions of the gasket away from the circuit board.

11. The combination as claimed in claim 10, wherein the retention module comprises four walls connected with each other and a flange being formed inwardly from bottoms of the walls for supporting the heat sink thereon.

12. The combination as claimed in claim 11, wherein the heat sink comprises a base plate and a plurality of fins arranged on the base plate, and the retention module comprises an abutting strip spacing from the flange, the base plate of the heat sink being sanwiched between the abutting strip and the flange.

13. The combination as claimed in claim 10, wherein a pair of bearing blocks is secured on the middle portions of the gasket for heating the circuit board.

14. A combination comprising:
a circuit board with an electronic component provided thereon;
a locking device comprising a retention module placed on the circuit board and a clip pivotably attached to the retention module;
a back plate unit located below the circuit board and secured with the retention module; and
a heat sink located on the electronic component, wherein the clip is pivotable between a first position in which the clip presses the heat sink toward the electronic component and a second position in which the clip pushes the heat sink in a direction away from the electronic component.

15. The combination as claimed in claim 14, wherein the clip comprises a connecting section pivotably attached to the retention module and a locking section extending substantially perpendicularly from one end of the connecting section.

16. The combination as claimed in claim 15, wherein the connecting section comprises a pressing portion pressing the heat sink toward the electronic component in the first position, and a pushing portion pushing the heat sink at the second position.

17. The combination as claimed in claim 14, wherein the back plate unit comprises a back plate secured with the retention module and an elastic gasket sandwiched between the circuit board and the back plate at the first position.

18. The combination as claimed in claim 17, wherein the retention module comprises a plurality of walls connected with each other and a flange being formed inwardly from bottoms of the walls for supporting the heat sink thereon.

19. The combination as claimed in claim 18, wherein the hear sink comprises a base plate and a plurality of fins arranged on the base plate, and the retention module comprises an abutting strip spacing from the flange, the base plate of the heat sink being sanwiched between the abutting strip and the flange.

* * * * *